(12) United States Patent
Kodama

(10) Patent No.: US 6,409,540 B1
(45) Date of Patent: Jun. 25, 2002

(54) CONNECTOR HAVING A GUIDE RIB WITH A HOLLOWED GROOVE PORTION

(75) Inventor: Shinji Kodama, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 353 days.

(21) Appl. No.: 09/023,198

(22) Filed: Feb. 13, 1998

(30) Foreign Application Priority Data

Feb. 14, 1997 (JP) .............................................. 9-030827

(51) Int. Cl.⁷ ........................ H01R 13/64; H01R 13/73; H02B 1/01
(52) U.S. Cl. ........................ 439/573; 439/680; 439/378
(58) Field of Search ................................. 439/573, 378, 439/572, 571, 569, 567, 680

(56) References Cited

U.S. PATENT DOCUMENTS 4,710,132 A  * 12/1987  Glomb et al. .................. 439/79

FOREIGN PATENT DOCUMENTS

JP          61-201288         12/1986

* cited by examiner

*Primary Examiner*—P. Austin Bradley
*Assistant Examiner*—Edwin A. León
(74) *Attorney, Agent, or Firm*—Sughrue Mion, PLLC

(57) ABSTRACT

A guide rib is protrusively formed on a bottom face of a connector housing to position the connector housing to a printed circuit board by piercing the printed circuit board. A groove portion is hollowly formed around a base portion of the guide rib to disperse the screw tightening stress and prevent the guide rib from cracking as the connector is fixed to the printed circuit board. It disperses stress caused by tightening a screw for connecting the connector housing with the printed circuit board, and therefore prevents cracking on the base portion of the guide rib resulting from concentration of the stress. Since the groove portion is hollowed, the connector housing adheres securely to the printed circuit board, therefore resulting in a stable mounting.

8 Claims, 4 Drawing Sheets

CONNECTOR HAVING A GUIDE RIB WITH A HOLLOWED GROOVE PORTION

BACKGROUND OF THE INVENTION

1. Technical Field of the Invention

The present invention relates to a connector mounted on a printed circuit board. More particularly, the present invention is directed to a connector having an improved structure for preventing the connector from cracking when attached to a printed board.

2. Background of the Related Art

A conventional connector mounted on a printed circuit board is shown in FIGS. 4–6. A bottom face 1a of a connector housing 1 is a mounting face which is mounted on a printed circuit board 2. Screw holes 4 which receive screws 8 are formed on the bottom face 1a, so that the bottom face 1a and the printed circuit board 2 are connected by the screws. Moreover, a connection area 3 for engaging with a mating connector is formed on a top face of the connector housing 1.

A plurality of terminals 5 are provided on the connector housing 1. Top portions 5a of the terminals 5 are projected to the connection area 3 of the connector housing 1, and bottom portions 5b of the terminals 5 are protruded from the bottom face 1a of the connector housing 1. The top portions 5a projecting to the connection area 3 are connected with terminals of the mating connector (not shown), and the bottom portions 5b protruding from the bottom face 1a are connected with the printed circuit board 2 as shown in FIG. 6. In FIG. 6, solders 9 achieve this connection.

To determine the position of the connector housing 1 with regard to the printed circuit board 2, a guide rib 6 is provided on the bottom face 1a of the connector housing 1. The guide rib 6 has a narrow stick-like shape and protrudes from one end portion of the connector housing 1 as shown in FIG. 4. As shown in FIG. 6, the position of the connector housing 1 is determined by inserting the guide rib 6 into insertion hole 7 formed on the printed circuit board 2. Furthermore, the guide rib 6 prevents irregular rotational movement of the connector housing 1 while it is being fixed to the printed circuit board 2 by use of the screws 8.

In such a conventional connector, when the screws 8 are tightened to fix the connector housing 1 to the printed circuit board 2, the tightening stress concentrates to an edge portion 10 which is around the guide rib 6 piercing the printed circuit board 2. Thus, a crack 11 occurs on a base portion of the guide rib 6 as shown in FIG. 7, and finally the guide rib 6 may break. Hence, the reliability of the mounting connector housing 1 to the printed circuit board 2 is compromised.

FIG. 8 shows an improved connector with tapered portions 12 formed around the base portion of the guide rib 6 to prevent the crack 11 from occurring on the base portion of the guide rib 6. The tapered portions 12 are formed such that the diameter of the arc gets larger than the base portion of the guide rib 6, toward the bottom face 1a of the connector housing 1. This causes the tightening stress of the screws 8 to be dispersed, so that the concentration of the tightening stress is reduced, and thus the crack on the base portion of the guide rib 6 can be avoided.

When such tapered portions 12 are formed, however, a gap d between the connector housing 1 and the printed circuit board 2 appears because the tapered portions 12 contact with the printed circuit board 2, and thus the connector housing 1 cannot adhere to the printed circuit board 2. This causes unstableness of the connector housing 1. As a result of the unstableness, other problems of the mounting can occur, such as the solders 9 being exfoliated.

SUMMARY OF THE INVENTION

The present invention has been made in view of the above problems, and an object of the invention is to provide a connector having a structure which prevents the cracking on the base portion of the guide rib caused by the tightening of the screws, and can be mounted stably on the printed circuit board.

The above object has been achieved with a connector of the present invention of claim 1 having a connector housing; terminals provided on a bottom face of the connector housing and connected to a printed circuit board; a guide rib protruded from the bottom face of the connector housing; and a hollowed groove portion formed around a base portion of the guide rib on the bottom face of the connector housing, wherein the position of the connector housing with regard to the printed circuit board is determined by the guide rib.

The groove portion surrounding the base portion of the guide rib disperses the stress that occurs when the connector housing is fixed on the printed circuit board. Since the stress does not concentrate to the base portion of the guide rib, the cracking on the base portion of the guide rib can be avoided.

Since the groove portion is formed in a hollow manner, this portion does not contact with the printed circuit board and is not an obstacle to the mounting of the connector housing. Thus, the connector housing can be attached on the printed circuit board stably.

Another aspect of the present invention provides screw holes for fixing the connector housing to the printed circuit board on the bottom face of the connector housing, and provides the guide rib near one of the screw holes.

By providing the screw hole near the guide rib, a tightening force of the screw directly effects the guide rib, so that the guide rib can be fixed firmly to the printed circuit board. Also, the groove portion is formed on the base portion of the guide rib so that the screw tightening stress can be dispersed, thus the cracking on the base portion of the guide rib is avoided.

Another aspect of the present invention provides a guide hole for piercing the guide rib on the printed circuit board. By piercing the guide rib through the guide hole, the positioning of the connector housing to the printed circuit board can be achieved securely.

DETAILED DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
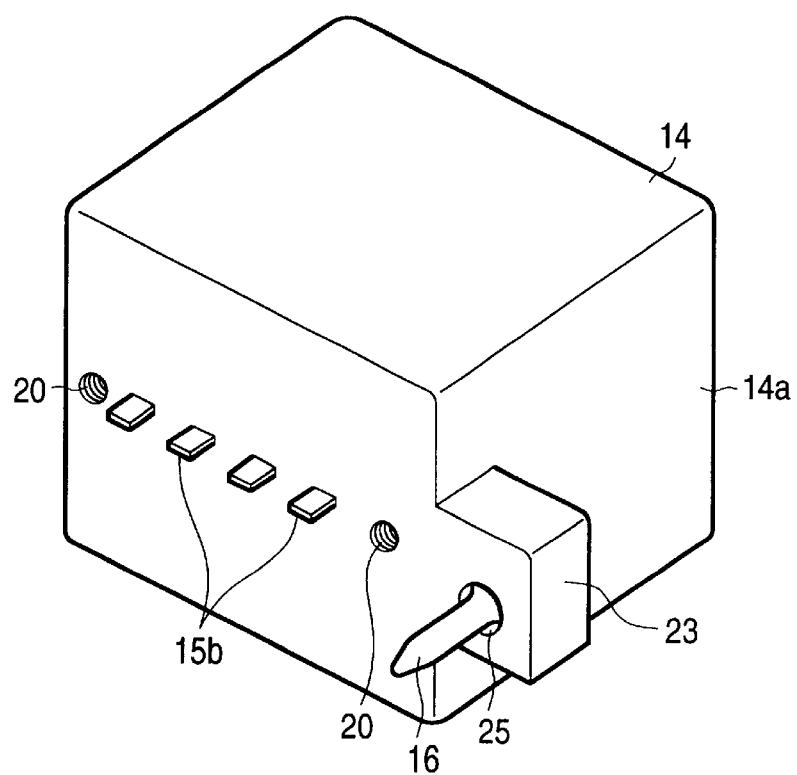
FIG. 1 is a perspective view of one embodiment of the present invention.
Figure 2:
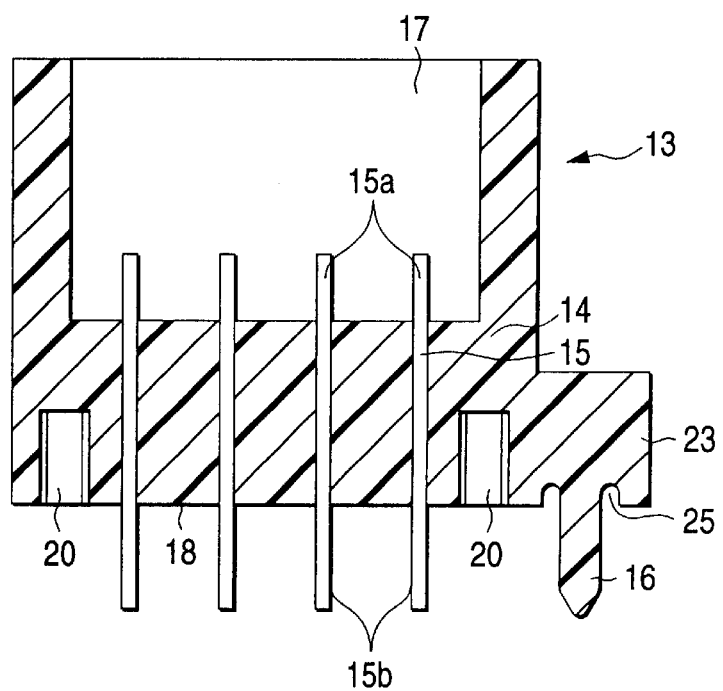
FIG. 2 is a cross-sectional view of one embodiment of the present invention.
Figure 3:
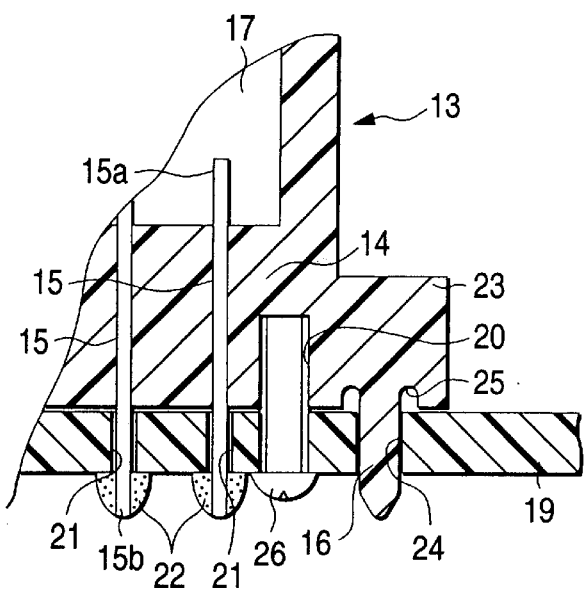
FIG. 3 is a partial cross-sectional view which shows the connector mounted on the printed circuit board.
Figure 4:
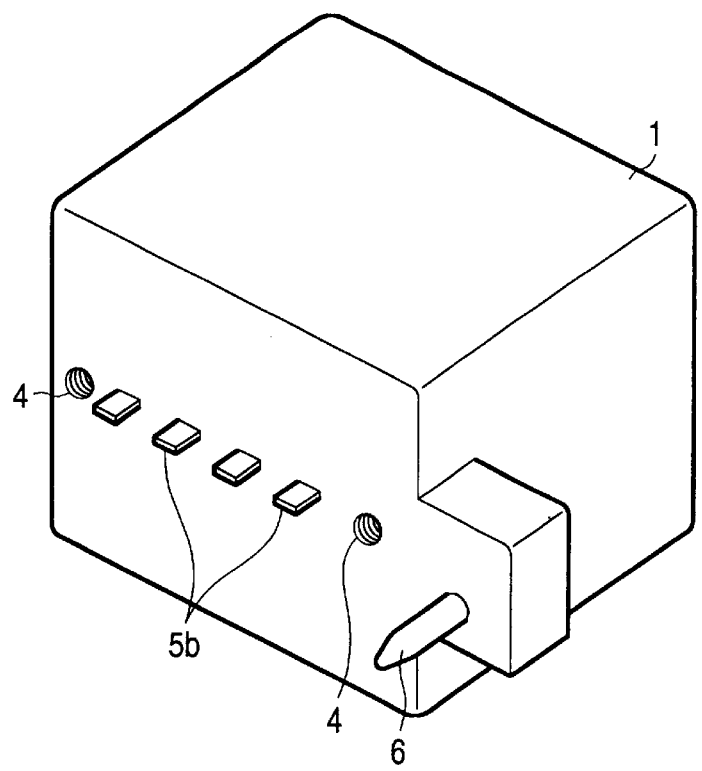
FIG. 4 is a perspective view of the conventional connector.
Figure 5:
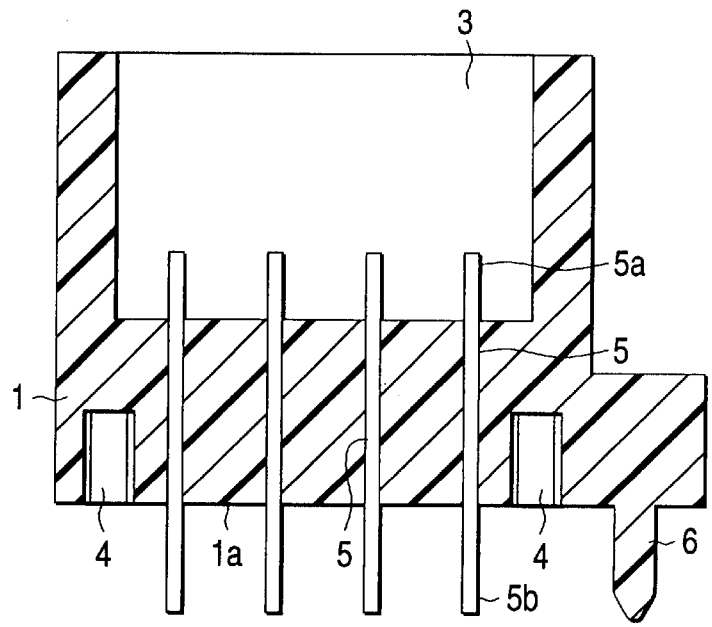
FIG. 5 is a cross-sectional view of the conventional connector.
Figure 6:
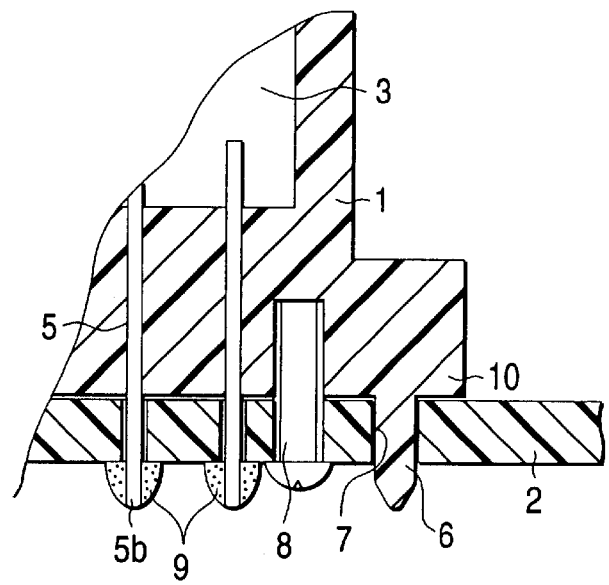
FIG. 6 is a partial cross-sectional view of the conventional connector mounted on the printed circuit board.
Figure 7:
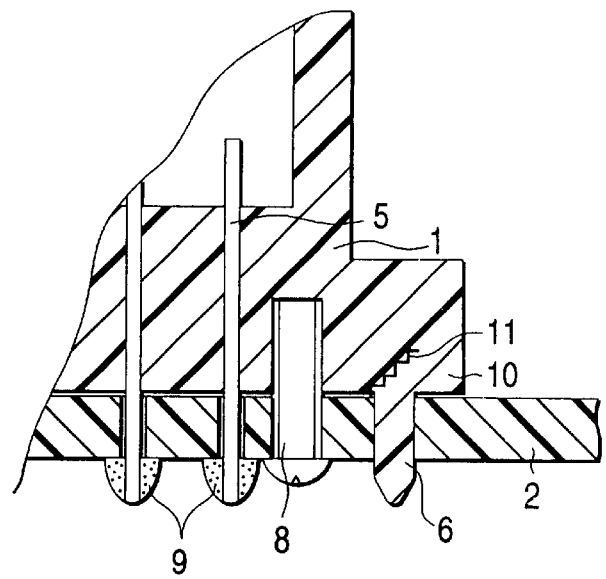
FIG. 7 is a partial cross-sectional view which shows the problems of the conventional connector.
Figure 8:
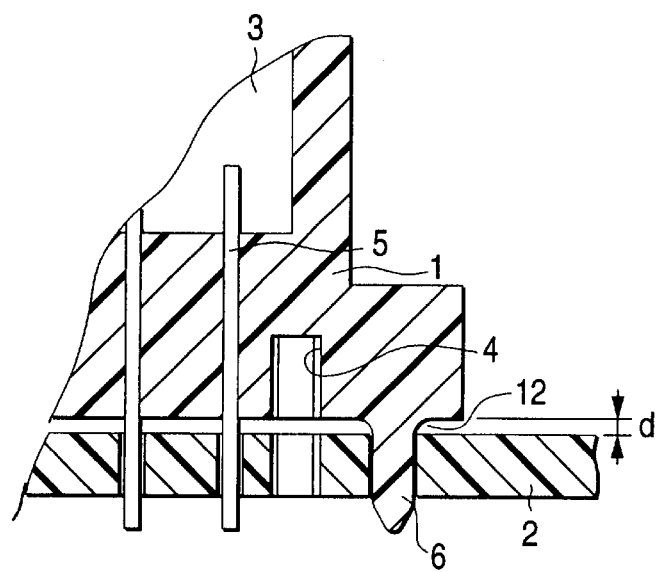
FIG. 8 is a partial cross-sectional view of the improved conventional connector.

FIG. 1 is a perspective view of one embodiment of the present invention, FIG. 2 is its cross-sectional view, and FIG. 3 is a cross-sectional view which shows a housing connector mounted on a printed circuit board. In this embodiment, a connector 13 comprises a connector housing 14 as an outer shell, a plurality of terminals 15 provided on the connector housing 14, and a guide rib 16 formed on the connector housing 14.

A top face of the connector housing 14 is hollow to form a connection area 17, a mating connector (not shown) is engaged and connected to the connection area 17. A bottom face 18 of the connector housing 14 is a mounting face which is mounted on the printed circuit board 19. Screw holes 20 for connecting with the printed circuit board 19 are formed in the connector housing 14 also.

The terminals 15 are initially provided within a mold forming the connector housing 14, then by injecting resin into the mold and setting, the terminals 15 are formed with the connector housing integrally. With this process, middle portions of the terminals 15 are securely fixed by the connector housing 14.

In the terminals 15, top portions 15a project into the connection area 17 of the connector housing 14 and connect with terminals of the mating connector. Bottom portions 15b of the terminals 15 protrude from the bottom face 18a of the connector housing 14, and connect with the printed circuit board 19. Through holes 21 for receiving the bottom portions 15b of the terminals are formed on the printed circuit board 19 as shown in FIG. 3. The bottom portions 15b of the terminals 15 pierce through the through holes 21 and the soldering 22, so that the printed circuit board 19 and the terminals 15 are connected by solders 22. The through holes 21 are provided on circuit patterns which are formed on the bottom side of the printed circuit board 19.

A block portion 23 is integrally formed on one side face 14a (right side face in FIG. 1) of the connector housing, juxtaposed by one of screw holes 20 which are provided on the bottom face 18 of the connector housing 14. The guide rib 16 is formed on the block portion 23.

The guide rib 16 has a stick-like shape and protrudes from the bottom face of the block portion 23, namely the bottom face of the connector housing 14. The guide rib 16 determines the position of the connector housing 14 when the connector 13 is mounted on the printed circuit board 19 by piercing through a guide hole 24 formed on the printed circuit board 19. Furthermore, the guide rib 16 prevents irregular rotational movement of the connector 13 while the connector housing 14 is being fixed to the printed circuit board 19 with the screws 26 (see FIG. 3).

A hollow groove portion 25 is formed on the bottom face 18 of the connector housing 14 so that it surrounds the base portion of the guide rib 16. By forming such a groove portion 25 on the base portion of the guide rib 16, the stress caused by tightening a screw 26 can be dispersed. Thus, since the tightening stress does not concentrate to the base portion of the guide rib 16, cracking caused by stress concentration can be prevented. Moreover, the groove portion 25 is formed to have a cavity shape and thus it does not contact the printed circuit board 19. Therefore, it is not an obstacle to the mounting of the connector housing, and the connector housing can be attached to the printed circuit board without a gap.

In this embodiment, the guide rib 16 is formed on the block portion 23 which is provided near the screw hole 20, thus the guide rib 16 is positioned near the screw hole 20. Hence, the tightening force of the screw directly effects the guide rib, so that the guide rib can be firmly fixed to the printed circuit board. As a result, the connector 13 can be firmly mounted on the printed circuit board 19.

In the present invention, the guide rib 16 may be partly inserted into the printed circuit board 19 without piercing the board 19. Furthermore, the groove portion 25 may be formed plurally.

As shown in FIG. 2, the grooved portion 25 may be curved at its most inner portion.

Thus, according to the present invention, the groove portion is formed so that the area surrounding the base portion of the guide rib disperses the stress caused by tightening the screw. Thus, since the tightening stress does not concentrate at the base portion of the guide rib, cracking caused by stress concentration can be prevented. Moreover, the groove portion is hollowly formed and thus it does not contact the printed circuit board. Therefore, it does not hinder the mounting of the connector housing, and the connector housing can be attached stably on the printed circuit board.

According to another aspect of the present invention, by providing the screw hole near the guide rib, a tightening force of the screw directly effects the guide rib, and therefore the guide rib can be fixed firmly to the printed circuit board.

According to another aspect of the present invention, by piercing the guide rib through the guide hole, the connector housing can be positioned to the printed circuit board securely.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A connector comprising:

a connector housing;

a terminal provided on a bottom face of said connector housing and connected to a printed circuit board;

a guide rib protruding from said bottom face of said connector housing;

a hollow groove portion formed around a base potion of said guide rib on said bottom face of said connector housing; and a screw hole, for fixing said connector housing to said printed circuit board, provided on said bottom face of said connector housing;

wherein the position of said connector housing with respect to said printed circuit board is determined by said guide rib.

2. The connector according to claim 1, wherein said guide rib is provided near said screw hole.

3. The connector according to claim 1 or 2, wherein a guide hole is provided on said printed circuit board so that said guide rib pierces said guide hole.

4. A connector comprising:

a connector housing;

a plurality of terminals provided on a bottom face of said connector housing and connected to a printed circuit board;

at least one guide rib protruded from said bottom face of said connector housing;

at least one hollow groove portion formed around a base portion of said guide rib on said bottom face of said connector housing and a plurality of screw holes provided on said bottom face of said connector housing for fixing said connector housing to said printed circuit board;

wherein the position of said connector housing with respect to said printed circuit board is determined by said guide rib.

5. A connector according to claim 4, wherein said guide rib is provided near one of said screw holes.

6. A connector according to claim 5, further comprising at least one guide hole provided on said printed circuit board, wherein said guide hole receives said guide rib.

7. A connector according to claim 6, wherein said printed circuit board is pierced by said guide rib through said guide hole.

8. A connector according to claim 4, wherein the inner portion of said groove portion is curved.

* * * * *